United States Patent
Withers et al.

(10) Patent No.: US 11,205,582 B2
(45) Date of Patent: Dec. 21, 2021

(54) METHODS AND APPARATUSES FOR EFFLUENT MONITORING FOR BRUSH CONDITIONING

(71) Applicant: Illinois Tool Works Inc., Glenview, IL (US)

(72) Inventors: Bradley Scott Withers, El Dorado Hills, CA (US); Corey Alan Hughes, Sacramento, CA (US); Erik Scott Nelson, Granite Bay, CA (US); Steven Kenneth Christie, Placerville, CA (US); Brent Allan Best, Rocklin, CA (US)

(73) Assignee: Illinois Tool Works Inc., Glenview, IL (US)

( * ) Notice: Subject to any disclaimer, the term of this patent is extended or adjusted under 35 U.S.C. 154(b) by 277 days.

(21) Appl. No.: 16/564,175

(22) Filed: Sep. 9, 2019

(65) Prior Publication Data

US 2020/0006162 A1    Jan. 2, 2020

Related U.S. Application Data

(63) Continuation of application No. 15/600,021, filed on May 19, 2017, now Pat. No. 10,410,936.

(51) Int. Cl.
*H01L 21/66* (2006.01)
*H01L 21/677* (2006.01)
(Continued)

(52) U.S. Cl.
CPC ...... *H01L 21/67253* (2013.01); *B24B 29/005* (2013.01); *B24D 13/145* (2013.01);
(Continued)

(58) Field of Classification Search
CPC ... B08B 1/007; H01L 22/26; H01L 21/67017; H01L 21/67253; H01L 21/67046;
(Continued)

(56) References Cited

U.S. PATENT DOCUMENTS 5,745,945 A   5/1998   Manfredi
5,794,299 A   8/1998   Gockel
(Continued)

FOREIGN PATENT DOCUMENTS

CN    102246272    11/2011
CN    102804354    11/2012
(Continued)

OTHER PUBLICATIONS

Search report dated Jul. 12, 2021 in Taiwan application No. 107116369, filed May 15, 2018 (4 pages).
(Continued)

*Primary Examiner* — David L Singer
(74) *Attorney, Agent, or Firm* — McAndrews, Held & Malloy, Ltd.

(57) ABSTRACT

A system for monitoring contamination level of effluent of an offline brush conditioning system includes a first set of reservoirs configured to collect first effluents from corresponding portions of a first brush and a second set of reservoirs configured to collect second effluents from corresponding portions of a second brush, and the first and second effluents are from a fluid used to condition the first and second brushes that are configured to clean a surface of a semiconductor wafer. An effluent contamination monitor is configured to monitor contamination levels of the first and second effluents, wherein the monitored contamination levels may provide feedback for use in the brush conditioning.

20 Claims, 7 Drawing Sheets

(51) Int. Cl.
    *B24B 29/00*     (2006.01)
    *H01L 21/02*     (2006.01)
    *B24D 13/14*     (2006.01)
    *H01L 21/67*     (2006.01)
    *B24B 53/14*     (2006.01)
    *B24B 57/02*     (2006.01)

(52) U.S. Cl.
    CPC .... *H01L 21/0201* (2013.01); *H01L 21/67017*
        (2013.01); *H01L 21/67028* (2013.01); *H01L*
        *21/67703* (2013.01); *H01L 22/26* (2013.01);
        *B24B 53/14* (2013.01); *B24B 57/02* (2013.01)

(58) Field of Classification Search
    CPC ......... H01L 21/67219; H01L 21/3212–32125;
        H01L 21/30625; H01L 21/0201; H01L
        21/67028; H01L 21/67703; Y10S
        134/902; Y10S 438/906; G01N
        2033/0095; A46B 2200/3086; A46B
        17/06–065; B24B 29/005; B24B 53/14;
        B24B 57/02; B24D 13/145
    USPC ........................... 73/61.71; 134/902; 438/692
    See application file for complete search history.

(56) References Cited

U.S. PATENT DOCUMENTS

| | | | |
|---|---|---|---|
| 5,834,642 A | 11/1998 | Decain | |
| 6,193,587 B1* | 2/2001 | Lin | B24B 53/017 451/287 |
| 6,272,712 B1* | 8/2001 | Gockel | H01L 21/67046 15/102 |
| 6,579,797 B1* | 6/2003 | Crevasse | B08B 1/00 257/E21.23 |
| 7,159,599 B2 | 1/2007 | Verhaverbeke | |
| 2003/0235926 A1 | 12/2003 | Knollenberg | |
| 2004/0178804 A1* | 9/2004 | Allen | G01N 27/221 324/662 |
| 2007/0039927 A1 | 2/2007 | Withers | |
| 2007/0087672 A1 | 4/2007 | Benner | |
| 2007/0119816 A1 | 5/2007 | Urquhart | |
| 2008/0216871 A1 | 9/2008 | Brown | |
| 2009/0287340 A1 | 11/2009 | Benner | |
| 2010/0144066 A1* | 6/2010 | Stephens | C23C 16/4412 438/14 |
| 2011/0094537 A1* | 4/2011 | Ko | B24B 37/20 134/6 |
| 2013/0185884 A1* | 7/2013 | Ko | B08B 1/006 15/209.1 |
| 2013/0196572 A1* | 8/2013 | Ko | H01L 21/67751 451/11 |
| 2013/0213895 A1 | 8/2013 | Criswell | |
| 2014/0209239 A1* | 7/2014 | Ko | H01L 21/304 156/345.14 |
| 2016/0254170 A1 | 9/2016 | Hu | |

FOREIGN PATENT DOCUMENTS

| | | |
|---|---|---|
| JP | 4215397 | 1/2009 |
| TW | I293366 | 2/2008 |
| TW | I390589 | 3/2013 |
| WO | 2011049671 A1 | 4/2011 |
| WO | 2011049671 A4 | 4/2011 |

OTHER PUBLICATIONS

Int'l Search Report and Written Opinion Appln No. PCT/US2018/030092 dated Jun. 26, 2018 (15 pgs).
Ruzyllo etal, Cleaning Technology in Semiconductor Device Manufacturing, Electrochemical Society Proceedings vol. 2001-26, pp. 187-194 (Year: 2001).

* cited by examiner

METHODS AND APPARATUSES FOR EFFLUENT MONITORING FOR BRUSH CONDITIONING

BACKGROUND

The present application is a continuation of U.S. Pat. No. 10,410,936 titled "METHODS AND APPARATUSES FOR EFFLUENT MONITORING FOR BRUSH CONDITIONING." The application for the U.S. Pat. No. 10,410,936 was filed on May 19, 2017. The contents of the above application is hereby incorporated herein by reference in its entirety.

In the semiconductor manufacturing industry and other industries, brushes are used to remove contaminants from surfaces, such as from semiconductor wafers. Conventional brushes are not received from the manufacturer in a condition to be used immediately. Instead, brushes are typically conditioned (or "broken in") before use on the intended products. Chemicals used during brush conditioning (referred to as effluent) may be collected for recycling and/or disposal.

Limitations and disadvantages of conventional approaches to effluent monitoring for conditioning brushes will become apparent to one of skill in the art, through comparison of such approaches with some aspects of the present method and system set forth in the remainder of this disclosure with reference to the drawings.

SUMMARY

Methods and apparatuses are provided for effluent monitoring for brush conditioning, substantially as illustrated by and described in connection with at least one of the figures, as set forth more completely in the claims.

BRIEF DESCRIPTION OF THE DRAWINGS

These and/or other aspects will become apparent and more readily appreciated from the following description of the exemplary embodiments, taken in conjunction with the accompanying drawings.

The figures are not necessarily to scale. Where appropriate, similar or identical reference numbers are used to refer to similar or identical components.

DETAILED DESCRIPTION

Figure 1A:
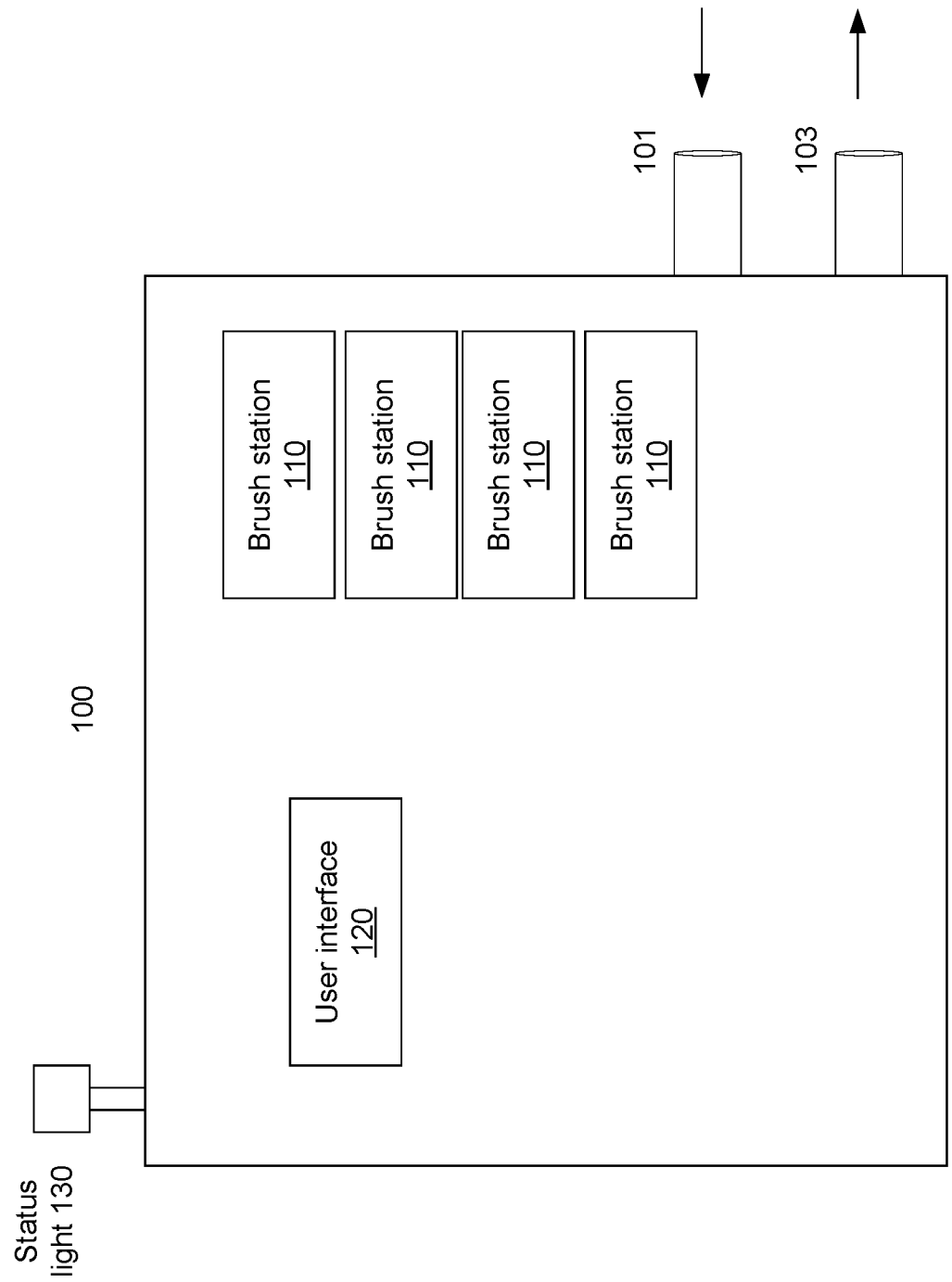
FIG. 1A shows a diagram of an example offline brush conditioning system, in accordance with aspects of this disclosure.

Various applications and processes may benefit from physical cleaning of a surface. For example, in semiconductor manufacturing a semiconductor wafer may be cleaned to remove potentially destructive contaminants during one or more stages of fabricating electronic circuits on the wafer. The cleaning can be provided by, for example, a brush that comes in contact with the surface to be cleaned. Conventional brushes are not received from the manufacturer in condition to be used immediately. For instance, the brush may have contaminants that counteract the cleaning of the object. Accordingly, there may be a desire to condition (season, break-in) the brush to remove the contaminants to an acceptable level for the intended use of the brush. Additionally or alternatively, one or more substances may be applied to the brush to condition the brush for a particular cleaning application.

While it should be understood that various embodiments of the disclosure may be used for different applications, example references in this disclosure will be made to conditioning a surface of a semiconductor wafer.

During a manufacturing process for a semiconductor wafer, a large number of contaminants may be found on the semiconductor wafer surface in the form of, for example, organic and/or inorganic particles. These contaminants will typically result in device failure and poor wafer yields. Moreover, with each new semiconductor technology node, the critical size of the defects on the semiconductor wafer and the tolerable number of defects on the semiconductor wafer becomes smaller.

The semiconductor industry may use post-chemical mechanical planarization (pCMP) cleaning in the manufacture of semiconductor devices where brushes such as, for example, polyvinyl acetate (PVAc) brushes, may be used in combination with application-specific cleaning agents and/or chemicals to remove particles from the semiconductor wafer surface.

The various brush types, including PVAc brushes, by nature of the material itself and/or the brush manufacturing/shipping process, will naturally release particles (organic and/or inorganic) when flushed and/or exposed to a fluid such as, for example, deionized water (DIW) and/or cleaning agents/chemicals. The quantity of particles released can be related to the nature of the fluid (DIW, cleaning agent, etc.) that the brush is exposed to, as well as the process conditions that the brush is used for (e.g., fluid flow rates, brush rotational speeds, etc.).

While the brushes may be cleaned by the brush manufacturer to reduce the level of releasable contamination prior to delivery to an end-user, an individual end-user may prefer a different threshold for the baseline-level of particle contamination in the brush.

Since some brushes are typically packaged, shipped, and stored in a hydrated state, with a preservation agent to prevent bacterial growth and product failure. The preservation, packaging, transportation, and storage process (e.g., shelf-life) may all adversely affect the intended pristine nature of the brush and contribute to the number of particles that can be released from the brush.

The nature of the brush manufacturing process, as well as the preservation, packaging, transportation, and/or shelf-life issues can all be compounding effects that require the end-user to condition (or season or break in) the brushes to remove some of the particles prior to using them in the semiconductor fabrication facility production tools.

The actual semiconductor layer being processed may dictate the level (and size) of acceptable particles that is released from the brush, and, hence, the time required to condition a brush. The time required for conditioning a brush may range from 10 minutes to 24 hours or more.

Conventional methods of conditioning brushes involve performing a conditioning process using dummy wafers for cleaning the brush on the systems that perform the cleaning of the end product. The resulting lost productivity and ultimately higher running costs are detrimental to the end-user.

Various embodiments of the disclosure may describe monitoring the effluent to optimize the process of conditioning a brush.

Disclosed example systems for monitoring contamination level of effluent of an offline brush conditioning system include a first reservoir configured to collect a first effluent from a first portion of a brush in the offline brush conditioning system and a second reservoir configured to collect a second effluent from a second portion of the brush. The second portion is different from the first portion, and the first and second effluents are from a fluid used to condition a brush configured to clean a surface of a semiconductor wafer. Also included in the system is an effluent contamination monitor configured to monitor a first and second contamination levels of the first effluent and the second effluent, respectively.

Disclosed example methods for monitoring contamination level of effluent of an offline brush conditioning system involve collecting a first effluent from a first portion of a brush in the offline brush conditioning system in a first reservoir and collecting a second effluent from a second portion of the brush in a second reservoir, where the second portion is different from the first portion and the first and second effluents are from a fluid used to condition a brush configured to clean a surface of a semiconductor wafer. An effluent contamination monitor may then determine a first and a second contamination levels of the first effluent and the second effluent, respectively.

FIG. 1A shows a diagram of an example offline brush conditioning system, in accordance with aspects of this disclosure. Referring to FIG. 1A, there is shown the offline brush conditioning system 100, which may comprise one or more brush stations 110, a user interface 120, and a status light 130.

There may be any number of individual brush stations 110 that may be used to simultaneously condition multiple brushes. Each brush station 110 may receive one brush for conditioning, where the conditioning can include multi-step processing capabilities (e.g., compression of the brush, rotational speed of the brush, DIW flushing and/or rinsing, etc.). The multiple brush stations 110 may be set up to condition brushes with the same process and/or set up independently to condition brushes with different processes. Also, while the brush station 110 has been described as conditioning one brush, in other examples multiple brushes may be conditioned by one brush station 110.

When a brush station 110 conditions a single brush, that brush can be isolated from cross-contamination by other consumables. When a brush station 110 is configured to handle multiple brushes, there may be barriers to isolate one brush from another to reduce cross-contamination. The amount of contamination in the brush(es) may be monitored by a contamination monitor.

The user interface 120 (e.g., a touchscreen, a display panel, buttons, a keyboard and mouse, etc.) may be used to enter commands to condition the brush(es) in the brush station 110, and also to view the conditioning status of the brushes. For example, the user interface 120 may be used to monitor and control the torque/speed used to rotate the brush as the brush is being conditioned.

The status light 130 may, for example, blink and/or show different colors to alert the end-user to a processing state for the brushes. The statuses indicated by the status light 130 may be design dependent.

In operation, one or more brushes may be placed in the offline brush conditioning system 100 and the conditioning process started. The status light 130 may indicate, for example, when the conditioning for at least one brush is finished. If the different brush stations 110 are set up for different conditioning processes that may take different lengths of time, the user interface 120 may give further indication of the status for each brush station 110.

The offline brush conditioning system 100 may be coupled to a fluid delivery system 101 in order to receive fluid(s) for use by the offline brush conditioning system 100. The offline brush conditioning system 100 may also be coupled to a fluid discharge system 103 in order to return fluid(s) that have been used by the offline brush conditioning system 100. The fluid delivery system 101 and the fluid discharge system 103 may belong to, for example, the end-user.

Figure 1B:
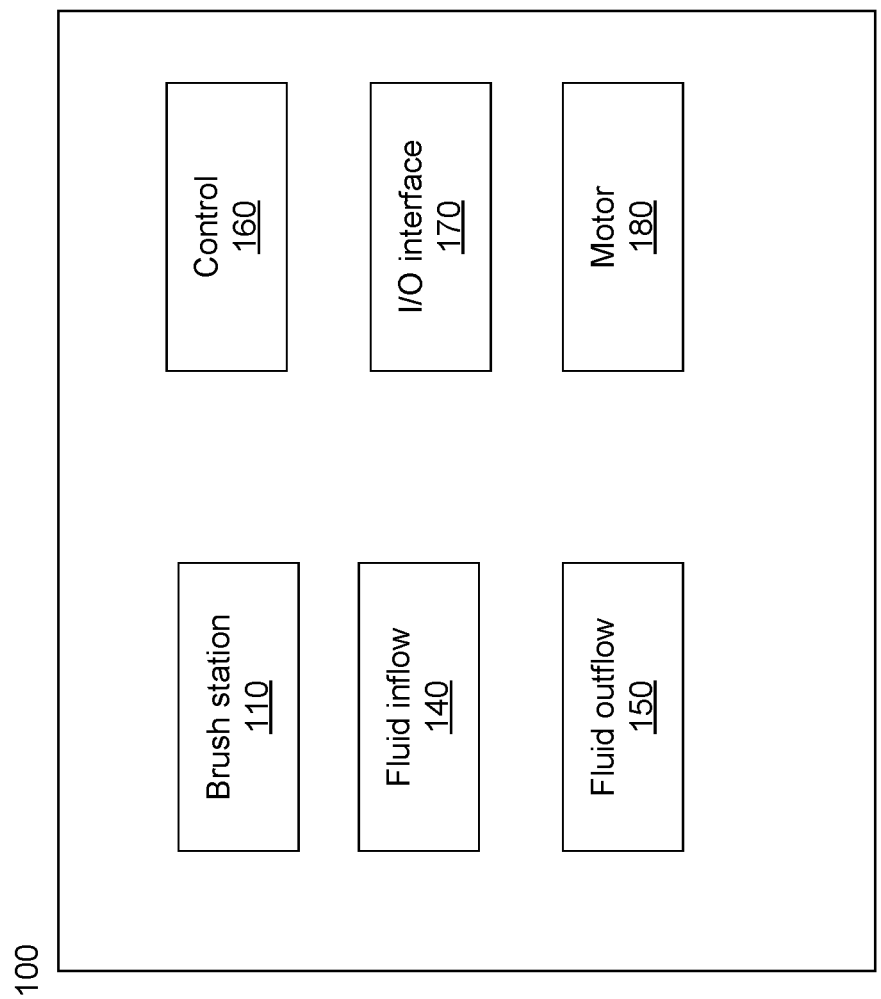
FIG. 1B is a block diagram of an example implementation of the offline brush conditioning system, in accordance with aspects of this disclosure.

FIG. 1B is a block diagram of an example implementation of the offline brush conditioning system, in accordance with aspects of this disclosure. Referring to FIG. 1B, there is shown the offline brush conditioning system 100 comprising the brush station 110, a fluid inflow system 140, a fluid outflow system 150, a control system 160, an input/output interface 170, and a motor system 180.

The brush station 110 may receive a brush that may be shaped like, for example, a cylindrical roller. While various embodiments of the disclosure may have a fixed axis for receiving the brush, other embodiments may allow receiving a brush at different angles and/or adjusting an angle after the brush has been received. This may allow for more flexibility in conditioning the brush and/or for accommodating different shapes of the brush.

The fluid inflow system 140 may comprise various fixtures for introducing fluids to the offline brush conditioning system 100 to be used for conditioning a brush and/or for other purposes. For example, there may be a fixture that couples to the fluid delivery system 101 for fluids such as, for example, chemicals for conditioning. Various embodiments of the disclosure may allow, for example, coupling to a plurality of fluid conduits provided by the fluid delivery system 101. Accordingly, this may allow for rapid change of fluids during use of the offline brush conditioning system 100. The fluid inflow system 140 may also comprise a distribution system for the received fluids to the brush(es) for conditioning the brush(es). Some embodiments may also have as part of the fluid inflow system 140 a container that may be used to store a fluid. This may be used to provide, for example, a buffer in cases of drop in pressure for the fluid inflow. This may also be used, for example, to allow the offline brush conditioning system 100 to be used when not connected to the end-user fluid supply line.

The fluid outflow system 150 may comprise various fixtures and devices for removing fluids that have been used in the process of conditioning a brush (i.e., effluent). In some embodiments, the fluid outflow system 150 may have dedicated outflow conduits that correspond to specific zones of the brush station 110. This may allow, for example, monitoring the effluents for characteristics of specific parts of a brush. The fluid outflow system 150 may, accordingly, comprise monitoring devices that can determine specific characteristics for the effluent.

The control system 160 may comprise various modules that control the operation of the offline brush conditioning system 100. For example, there may be one or more processors (microprocessors, microcontrollers, etc.) that execute code stored in memory and process data received from external devices or via the I/O interface 170. The processor(s) may then control operation of the brush conditioning process including the rotational speed of the brush and compression of the brush against a conditioning plate. This may allow, for example, controlling the level of conditioning (e.g., pressure, intensity, duration, chemistry, etc.) applied to the brush.

The processor(s) may also control switching among the plurality of fluids if the offline brush conditioning system 100 is coupled to receive different types of fluids from the end-user, or possibly using the container if the container is available.

The control system 160 may also control, for example, the flow rate of fluids such as chemicals and/or ultra-pure water (UPW). The characteristics of UPW will not be described as they may differ from application to application. Accordingly, it should be understood that UPW refers to water that is considered to have suitable "UPW" characteristics for an application at issue. The control system 160 may also, for example, control diluting a chemical using fluid from the container, if a container is available, or from another end-user conduit.

The I/O interface 170 may comprise various devices that may allow information and commands to be input to the offline brush conditioning system 100, as well as to display and/or communicate with external devices. For example, the user interface 120 may be a part of the I/O interface 170. The I/O interface 170 may also comprise, for example, one or more of various buttons, switches, LEDs/lights, keyboard, mouse, trackball, etc., for entering input as well as displaying outputs. The I/O interface 170 may also comprise various ports for wired communication such as USB ports, Ethernet ports, etc. The I/O interface 170 may also support wireless communication technologies and protocols such as, for example, cellular communication, Bluetooth communication, near field communication, Wi-Fi communication, RFID communication, etc.

The I/O interface 170 may be used to allow status to display at remote stations or devices and/or to allow remote control of the offline brush conditioning system 100. The I/O interface 170 may also allow updating of various software/firmware and applications in the offline brush conditioning system 100 via a wired or wireless connection. Additionally, the I/O interface 170 may allow remote control of the offline brush conditioning system 100.

The motor system 180 may comprise one or more motors that are used to rotate one or more brushes for conditioning. The motor(s) in the motor system 180 can comprise appropriate motors for rotating the brush(es) as they are conditioned. The motors in the motor system 180 may be controlled to have variable speed and/or torque. Various embodiments may also comprise a motor system that is able to provide information regarding a present torque. This information may be used to determine, for example, whether the conditioning is progressing as expected. Various embodiments may provide for one motor to drive one brush, while other embodiments may allow for one motor to drive multiple brushes. Still other embodiments may allow for one motor to drive a single brush or multiple brushes.

Figure 2:
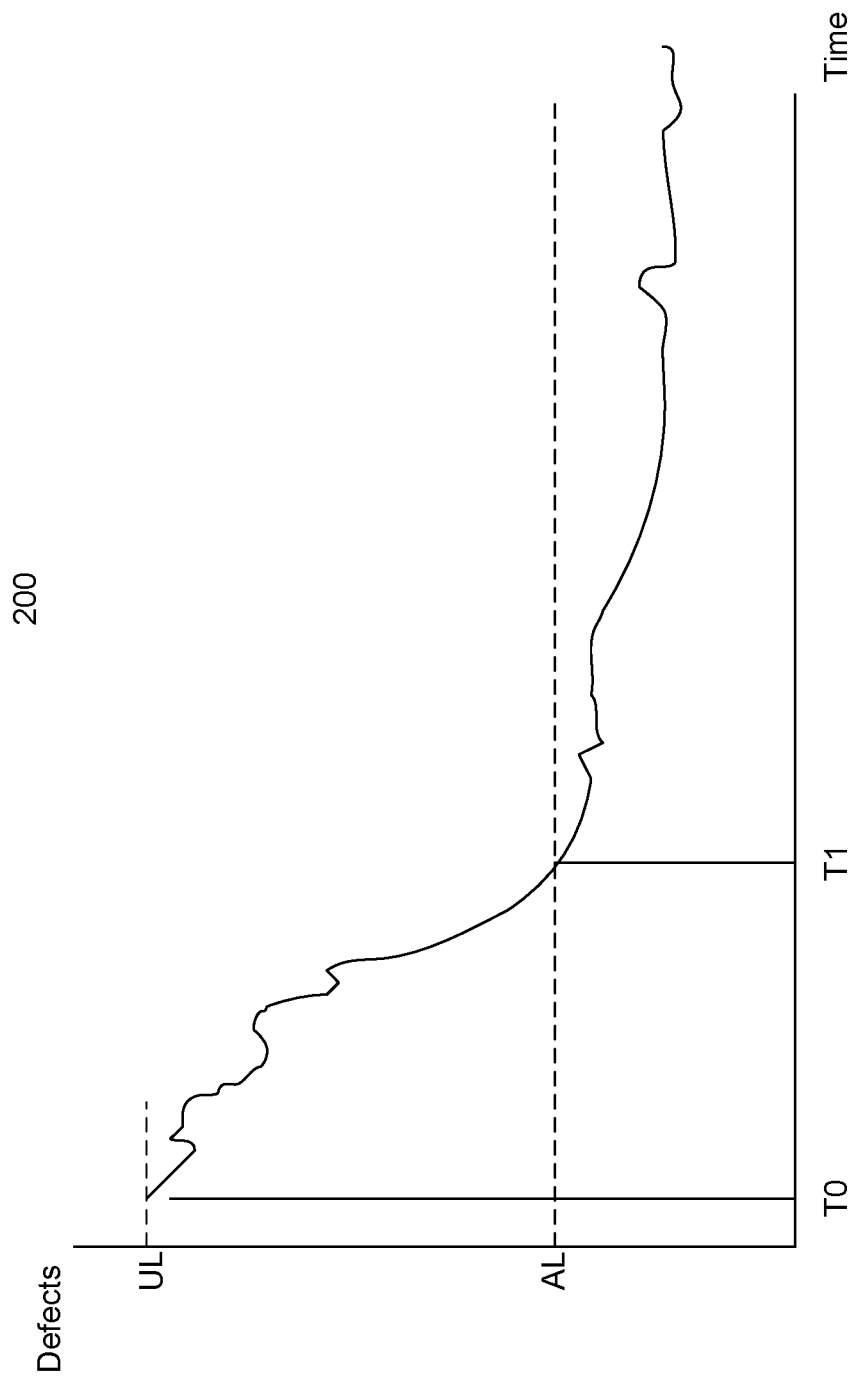
FIG. 2 is a graph illustrating an example relationship between defects and conditioning time.

FIG. 2 is a graph illustrating an example relationship between defects and conditioning time. Referring to FIG. 2, there is shown a graph 200 that shows defects on the Y-axis and time on the X-axis. At time T0 when brush conditioning first starts, there may an unacceptable level of "defect" of UL, where defect refers to the amount of particles released and/or size of particles released by a brush. The defect may be monitored by, for example, examining the effluent. As conditioning continues over time, the defect level may reduce to an acceptable level AL at time T1. The time T1 may vary depending on the defect level required. Any amount of time used to condition the brush(es) by the offline brush conditioning system 100 is the amount of time that the production system can continue to operate to produce semiconductor wafers, and thus save the end-user valuable production time and money. In some cases, a particular type of brush may be well characterized such that the conditioning can be set for a period of time without having to monitor the defects.

Figure 3:
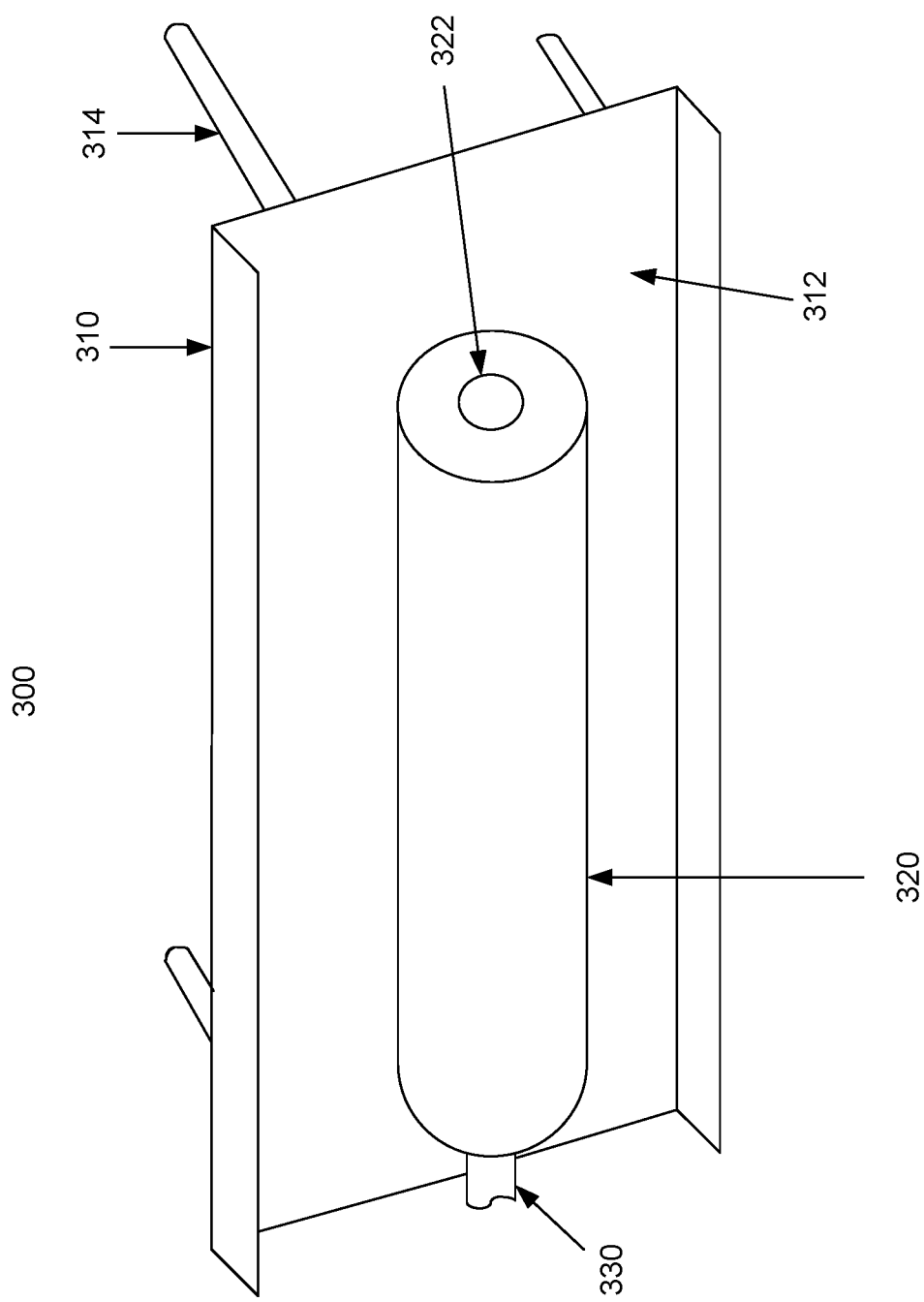
FIG. 3 illustrates an example arrangement of a brush and a conditioning plate for conditioning the brush, in accordance with aspects of this disclosure.

FIG. 3 illustrates an example arrangement of a brush and a conditioning plate for conditioning the brush, in accordance with aspects of this disclosure. Referring to FIG. 3, there is shown a diagram 300 that illustrates the conditioning plate (conditioning surface) 310 and the brush 320 in a brush station 110. The brush 320 comprises an axial opening 322. One end of the axial opening 322 may be used to hold the brush 320 when the brush 320 is used to clean a surface of, for example, a semiconductor wafer. When the brush 320 is being conditioned, a brush support 330 may be used to hold the brush 320. Example brush support 330 may include a bracket, a post, and/or any other type of support. The brush support 330 may be connected to the motor system 180. Fluids used to condition the brush may be introduced to the brush 320 via the end of the axial opening that is not coupled to the brush support 330. The brush support 330 may be adjusted to different sizes to allow for different sized axial openings that different brushes may have. Various other parts may be used to firmly fasten the brush 320 to the coupling part 322, however these parts will not be described in this disclosure as there are well known methods of fastening a structure such as a brush 320 to a brush support 330.

The conditioning plate 310 may be flat or have other shapes, such as, for example, a curved surface. The surface may be, for example, flat, concave, convex, tubular, meshed, and/or biased (e.g., left-to-right), etc., to alter the conditioning characteristics of the brush 320. The conditioning plate 310 may be made of appropriate materials such as, for example, glass, quartz, silicon dioxide, poly silicon, silicon nitride, silicon carbide, tungsten, titanium, titanium nitride, aluminum, aluminum oxide, tantalum, tantalum nitride, copper, ruthenium, cobalt, etc., depending on a nature of the surface that is to be cleaned by the conditioned brush (e.g., Si, $SiO_2$, SiC, SiOC, SiN, W, TiW, TiN, TaN, Cu, Ru, GaAs, GaP, InP, sapphire, any combination of these materials, etc.).

The surface 312 of the conditioning plate 310 can have different characteristics as needed for conditioning a brush 320. For example, the conditioning plate 310 can have a surface 312 that is smooth, rough, or contain abrasive material such as, for example, $SiO_2$, SiC, $Al_2O_3$, $CeO_2$, etc. Accordingly, to provide different characteristic(s) for the surface 312, the surface 312 may be replaced as appropriate, or the conditioning plate 310 may be replaced. The surface 312 used to condition the brush 320 can contact the entire brush or just a portion of the brush 320.

Different brushes 320 may have different sizes for the length, the diameter of the axial opening 322, and/or the outer diameter. The brush support 330 and the conditioning plate 310 may be adjusted and/or replaced to accommodate the different sizes and/or conditioning requirements. The control system 160 may also take into account the different sizes when controlling the motor speed/torque and/or introduction of fluid to condition the brush 320.

The conditioning plate 310 may be moved by a motor (not shown) that is connected to, for example, one or more of the legs 314. The motor may be, for example, a stepper-motor that can move the conditioning plate 310 forward to contact the brush 320, where the brush 320 may be stationary or rotating. The extent of contact between the conditioning plate 310 and the brush 320 can be monitored and controlled by distance (e.g., 0-5 mm of compression) and/or brush motor torque output. The monitoring and controlling may be performed by, for example, the control system 160.

Various embodiments may characterize (map) the pressure exerted by the brush 320 on the conditioning plate 310 via, for example, embedded or adhered tactile pressure sensors in the conditioning plate 310.

The torque data may be used to directly or indirectly verify the quality of the brush 320 (e.g., concentricity, brush uniformity, etc.). Various embodiments may also make adjustments to the conditioning process based on various feedback data such as, for example, contact area, pressure, force, etc. that may be collected by various pressure sensing devices.

As shown in an example in FIG. 3, the brush 320 is coupled on the left side to the brush support 330 to allow a motor to rotate the brush 320 at various speeds (e.g., up to 1000 RPM) and monitor the torque output of the motor as the brush 320 is conditioned. The right side of the brush 320 may allow delivery of fluid (chemical, UPW, etc.) to the interior of the brush 320. The delivery of fluid (chemical and/or UPW) may be to the outside surface of the brush 320. Various embodiments may deliver fluid to both the inside of the brush 320 and to the outside surface of the brush 320. Flow of fluid to the brush 320 may be controlled by, for example, one or more valves that may be controlled manually by an operator or automatically by the control system 160. The flow may be varied to different ranges such as, for example, an example range of 0-5 GPM.

Furthermore, fluid may also be delivered to the conditioning plate 310. The delivery of the fluid to the conditioning plate 310 may be at an appropriate time for conditioning the brush 320. Additionally, some embodiments may allow different fluids to be delivered to the brush 320 and the conditioning plate 310.

Figure 4A:
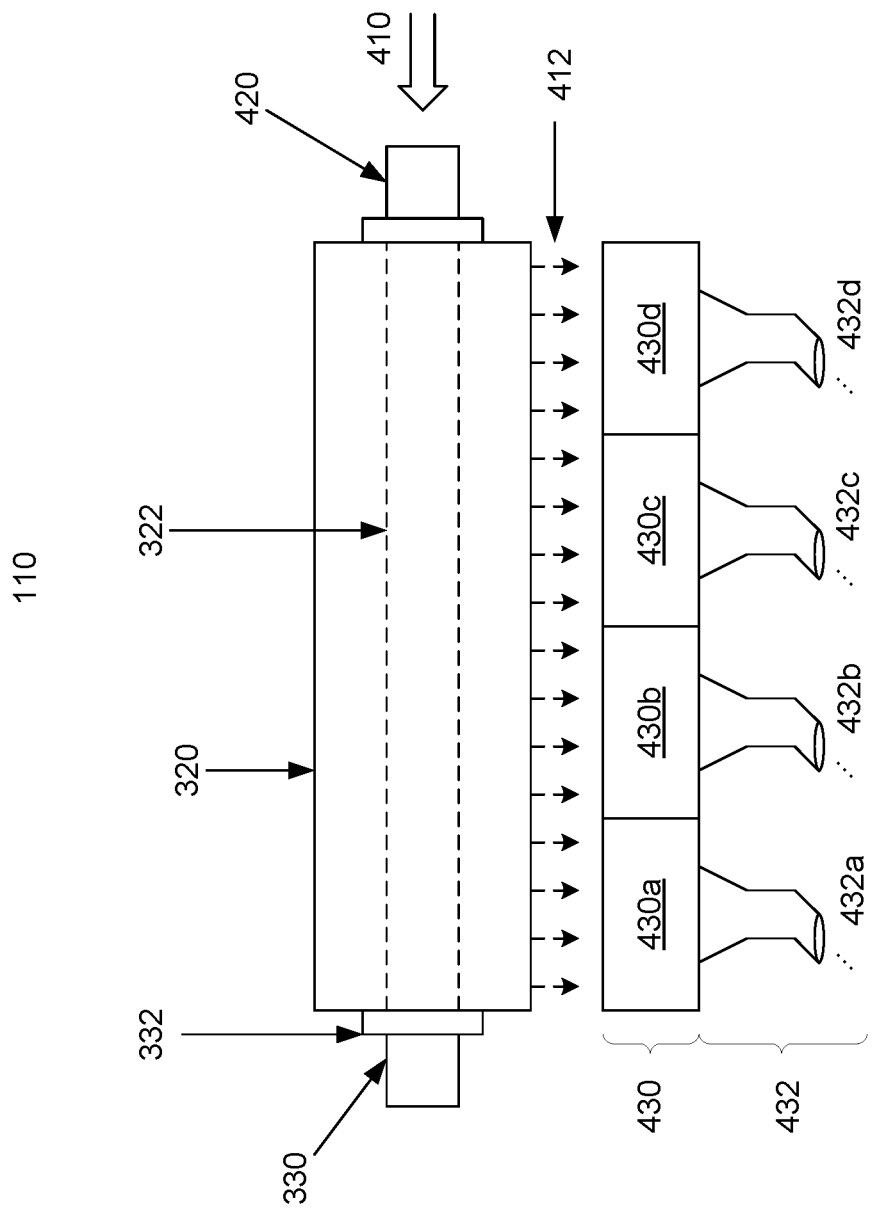
FIG. 4A illustrates an example configuration for collecting effluent from an offline brush conditioning system, in accordance with aspects of this disclosure.

FIG. 4A illustrates an example configuration for collecting effluent from an offline brush conditioning system, in accordance with aspects of this disclosure. Referring to FIG. 4A, there is shown a brush station 110 with a brush 320, a reservoir system 430 for collecting effluent, and a drain system 432 for carrying the effluent from the reservoir system 430. The reservoir system 430 may be a single reservoir or a plurality of reservoirs. While FIG. 4A depicts four reservoirs 430a, 430b, 430c, and 430d, other embodiments may have a different number of reservoirs. A reservoir may be made with material to minimize cross-contamination from the reservoir itself. For example, the material for a reservoir may be one or more of quartz, perfluoroahoxy alkane (PFA), polyvinylidene fluoride (PVDF), polyethylene terephthalate (PET), etc.

Train system 432 may have various drain configurations for different embodiments. For example, there may be a drain for each reservoir, there may be a single drain that handles multiple reservoirs, or multiple drains that handle a single reservoir. FIG. 4A depicts an example of four drains 432a, 432b, 432c, and 432d to carry effluents from the reservoirs 430a, 430b, 430c, and 430d, respectively.

As described previously with respect to FIG. 3, the brush support 330 may be used to hold the brush 320 at one end. The sleeve 332 may be used, for example, to help couple the brush 320 to the brush support 330 and/or perform as a seal, or include a separate seal, to prevent leakage of fluid 410 that is delivered to the axial opening 322 of the brush 320. Accordingly, the fluid 410 delivered via the conduit 420 can flow through to the surface of the brush 320 from the interior of the brush 320 during the conditioning process for the brush 320. The fluid from the brush 320, which may be referred to as effluent 412, is then collected by the individual reservoirs 430a, 430b, 430c, and 430d. Accordingly, it can be seen that each individual reservoir will collect the effluent 412 from a specific portion (zone) of the brush 320.

The effluent 412 will be carried by the drain system 432 to the fluid discharge system 103 for disposal and/or recycling. While not shown, the offline brush conditioning system 100 may have one or more effluent containers for temporarily storing the effluent 412. This may be useful, for example, in cases when there is a temporary stoppage in the fluid discharge system 103. Various embodiments may also use the effluent containers to store the effluent 412 for non-real-time monitoring, as well as for other purposes.

The plurality of reservoirs 430a, 430b, 430c, and 430d may be used to monitor, for example, volume of the effluent 412 per zone of the brush 320 to determine whether delivery of the fluid 410 is uniform along the length of the brush 320. The plurality of reservoirs 430a, 430b, 430c, and 430d can also be used to evaluate and quantify specific zones of the brush 320 independently or with respect to other zones. Brush flow rate variation among the zones may be used, for example, to determine a flow rate variation for the brush 320. This may allow, for example, a determination of the point of use chemical concentration (variation) applied to the substrate that will be cleaned by the brush 320 and the reduction of specific defect modes such as, for example, scratching.

Figure 4B:
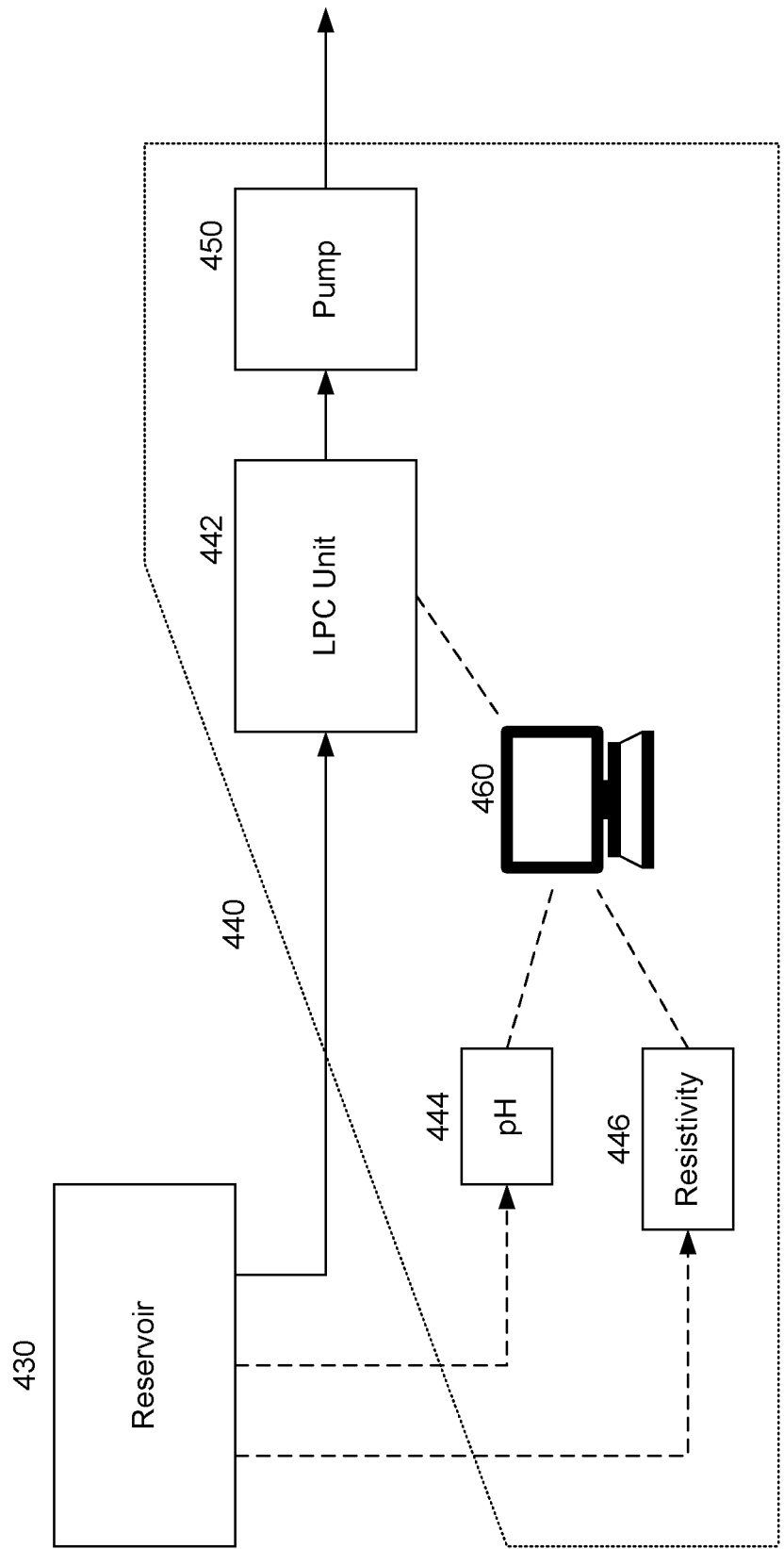
FIG. 4B illustrates an example monitoring system for effluent from an offline brush conditioning system, in accordance with aspects of this disclosure.

FIG. 4B illustrates an example monitoring system for effluent from an offline brush conditioning system, in accordance with aspects of this disclosure. Referring to FIG. 4B, there is shown an example monitoring system 440 that comprises contamination monitors such as, for example, a liquid particle counter (LPC) 442, a pH measurement unit 444, and a resistivity measurement unit 446, as well as a data storage device 460. The LPC 442 may use, for example, laser light scattering measurement technology and/or any other technology for particle counting. A pump 450 is downstream of the LPC 442 to ensure flow of the effluent. The pump 450 may be, for example, an impeller pump, a centrifugal pump, a peristaltic pump, etc.

The LPC 442 counts the number of particles per volume of the effluent 412. Accordingly, a declining number of particles in the effluent 412 may indicate progress in the conditioning of the brush 320. The pH measurement unit 444 measures the pH of the effluent 412. The pH of the fluid delivered to condition the brush 320 may be affected by the particles released by the brush 320 during its conditioning. Accordingly, the pH of the effluent 412 may indicate the progress of conditioning of the brush 320. The resistivity of the effluent 412 is measured by the resistivity measurement unit 446. The resistivity of the fluid delivered to condition the brush 320 may be affected by the particles released by the brush 320 during its conditioning. Accordingly, the resistivity of the effluent 412 may indicate the progress of conditioning of the brush 320.

The data from measurements made by the measurement units may be recorded in real-time or non-real-time in the data storage device 460. The data storage device 460 may comprise appropriate circuitry to be able to store the data provided by the measurement units (e.g., the LPC 442, the pH measurement unit 444, and the resistivity measurement unit 446 in this example). The data may be stored in volatile and/or non-volatile memory, including, for example, FLASH memory, hard drives, CD/DVD disks, removable memory devices such as USB memory sticks, etc.

The data storage device 460 may be, for example, a part of the control system 160 or a separate unit in the offline brush conditioning system 100. The measurement data stored in the data storage device 460 may be displayed via the user interface 120. The stored measurement data may also be shown on a remote display (not shown) via a wired or wireless connection in the I/O interface 170. Similarly, the measurement data may be uploaded to a server (not shown) via a wired or wireless connection.

While FIG. 4B shows an example configuration of an embodiment of the disclosure, other configurations may have only one or two of the LPC 442, the pH measurement unit 444, and the resistivity measurement unit 446. Various embodiments may have in addition to, or in place of, any of the measurement units shown in FIG. 4B, other measurement units that may be used to characterize the effluent 412.

Furthermore, various embodiments may have one particular measurement unit for the reservoir system, or one measurement unit for each reservoir or for a plurality of reservoirs. When a measurement unit is shared, the measurements may be time multiplexed. For example, when a single LPC 442 is used, the LPC 442 may use a system that allows effluent 412 from each of the reservoirs 430a, 430b, 430c, and 430d to be sampled by the LPC 442 for periodic real-time measurements. However, if there is an LPC 442 for each of the reservoirs 430a, 430b, 430c, and 430d, then each LPC can make continuous real-time measurements for its respective reservoir.

The pump 450 can provide a continuous flow of the effluent 412 for real-time measurements by the various measurement units. The pump 450 may also be used to pump a fluid, such as, for example, UPW, during an idle mode when the offline brush conditioning system 100 is not being used to condition the brush 320. The LPC 442 may or may not be in operation during the idle mode. Various embodiments may also use multiple pumps for pumping the effluent 412 from multiple reservoirs. Some embodiments may use a pump that may be a part of, for example, the fluid discharge system 103.

In various embodiments, the operation of the offline brush conditioning system 100, including the LPC 442, the pH measurement unit 444, the resistivity measurement unit 446, the pump 450, storing measurement data, etc., may be controlled by, for example, the control system 160.

Figure 5:
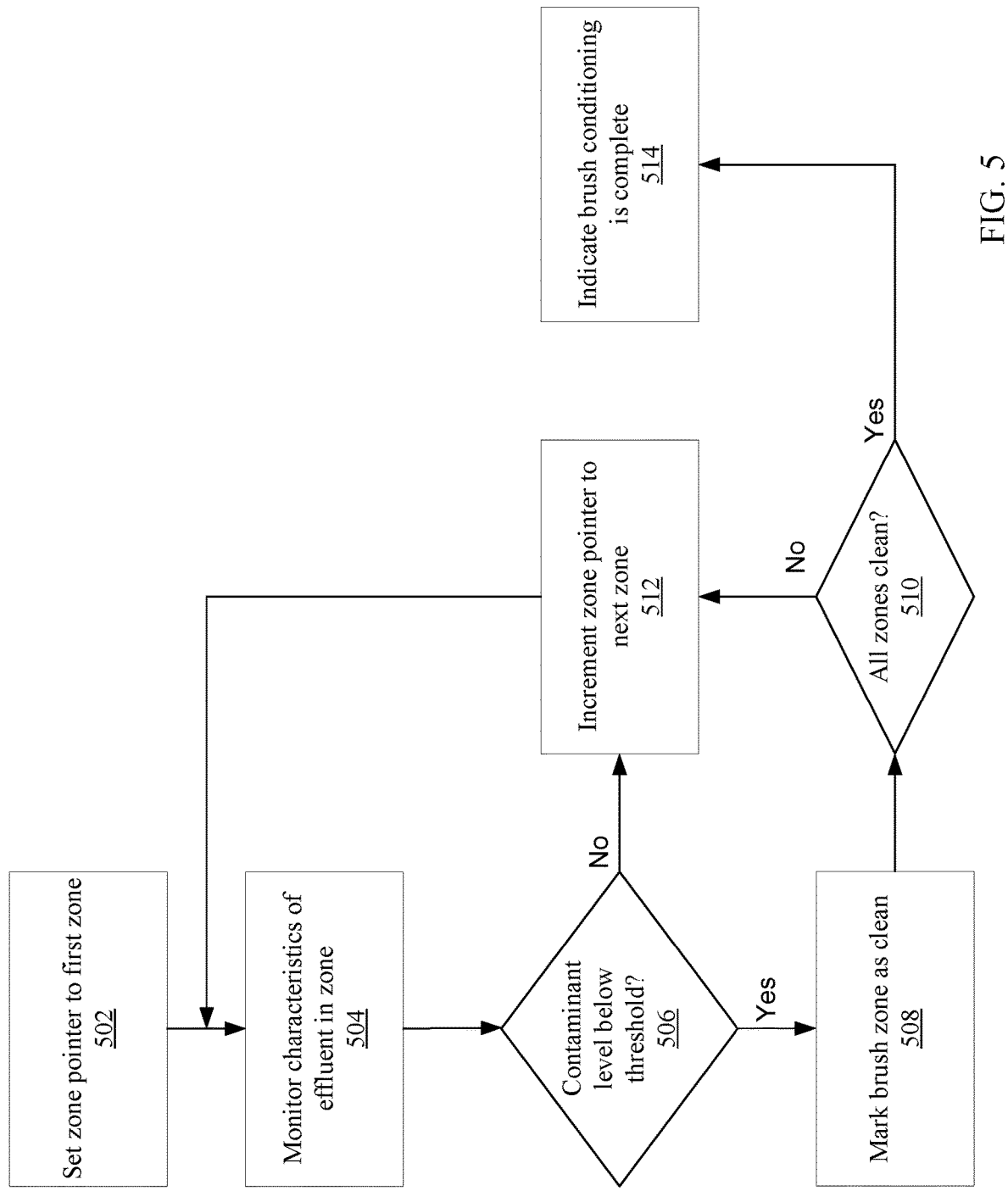
FIG. 5 is a flow diagram of an example method of monitoring effluent from an offline brush conditioning system, in accordance with aspects of this disclosure.

FIG. 5 is a flow diagram of an example method of monitoring effluent from an offline brush conditioning system, in accordance with aspects of this disclosure. In the example described by the flow diagram 500, there are multiple zones of the brush 320 and at least one measurement unit is multiplexed to gather data for the plurality of zones.

Referring to the flow diagram 500 of FIG. 5, at 502 the control system 160 may initialize a zone pointer, which may be a hardware register or a software variable, to a first zone, and the effluent 412 can be collected as the brush 320 is conditioned.

At 504, the measurement unit(s) may generate various measurement data such as, for example, liquid particle counts, pH, and resistivity of the effluent for the particular zone indicated by the zone pointer. The measurement data may be stored in the data storage device 460. The measurement data may be correlated to time for further analysis of the conditioning process. For example, the conditioning process may be characterized for the number of particles detected at various times after the conditioning process has started. This may be used, for example, for generating a defect graph such as the one shown in FIG. 2, correlating the measurement data from the different measurement units to each other as well as to the conditioning process, etc.

At 506, a determination may be made as to whether a contamination level may be below a threshold level. The contamination level may be a measurement of a particular measurement device such as, for example, the LPC 442, or a score based on measurements of two or more measurement devices. If the contamination level is not below the threshold level, then the zone pointer is incremented at 512 to continue monitoring of the next zone.

If the contamination level is below the threshold level, then the present zone may be marked as clean at 508. At 510, a determination may be made as to whether all zones have been marked as clean. If so, the offline brush conditioning system 100 may indicate at 514 that the brush 320 has been conditioned appropriately.

If all zones are not marked as clean, then the zone pointer is incremented at 512 to the next zone, and the process continues at 504 to further condition the brush 320.

In some embodiments, even after all zones have been marked as clean, there may be at least one more round of effluent monitoring to verify that the contamination levels of all zones are below the threshold level. In some embodiments, the fluid flow to the brush 320 may be controlled to allow fluid to substantially those portions of the brush 320 that still need to be conditioned. This may be done with a dispensing device that can provide fluid delivery at various zones under control of, for example, the control system 160.

The present methods and systems may be realized in hardware, software, and/or a combination of hardware and software. The present methods and/or systems may realize, for example, the control system 160 in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise one or more application specific integrated circuit or chip. Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed:

1. A system for monitoring contamination level of effluent of an offline brush conditioning system, the system comprising:
    a first set of reservoirs configured to collect first effluents from corresponding portions of a first brush in a first brush station in the offline brush conditioning system;
    a second set of reservoirs configured to collect second effluents from corresponding portions of a second brush in a second brush station, wherein the first and second effluents are from a fluid used to condition the first and second brushes that are configured to clean a surface of a semiconductor wafer; and
    an effluent contamination monitor configured to monitor contamination levels of the first effluent from the first set of reservoirs and contamination levels of the second effluent from the second set of reservoirs.

2. The system of claim 1, further comprising a control system configured to:
    control the conditioning of the first brush by comparing the contamination levels of the first effluent in the first set of reservoirs to a first contamination threshold; and
    control the conditioning of the second brush by comparing the contamination levels of the second effluent in the second set of reservoirs to a second contamination threshold.

3. The system of claim 2, the control system is configured to correlate at least one contamination level of the first effluent or the second effluent with time.

4. The system of claim 1, wherein a material for at least one reservoir of the first set of reservoirs or the second set of reservoirs comprises at least one of quartz, perfluoroalkoxy alkane (PFA), polyvinylidene fluoride (PVDF), or polyethylene terephthalate (PET).

5. The system of claim 1, wherein the contamination levels comprises at least one of: a liquid particle count, a pH level, or a resistivity.

6. The system of claim 5, wherein the effluent contamination monitor comprises a liquid particle counter (LPC) configured to measure the liquid particle count.

7. The system of claim 6, wherein the LPC is configured to use a laser light scattering measurement system.

8. The system of claim 5, further comprising a control system configured to record to memory at least a portion of the contamination levels of the first effluent and the second effluent in real-time.

9. The system of claim 1, further comprising a pump system downstream of the first and second sets of reservoirs configured to pump the first and second effluents.

10. The system of claim 1, further comprising a corresponding brush support for each of the first and second brush stations.

11. The system of claim 10, wherein at least one brush support is at a fixed angle in the respective brush station.

12. The system of claim 10, wherein at least one brush support is configured to perform one or both of:
    receive a brush for conditioning in one of a plurality of different angles; and
    adjust an angle of a brush received for conditioning.

13. A method for monitoring contamination level of effluent of an offline brush conditioning system, the method comprising:
    collecting, in a first set of reservoirs, first effluents from corresponding portions of a first brush in a first brush station of the offline brush conditioning system;
    collecting, in a second set of reservoirs, second effluents from corresponding portions of a second brush in a second brush station, wherein the first and second effluents are from a fluid used to condition the first and second brushes that are configured to clean a surface of a semiconductor wafer; and
    monitoring, by an effluent contamination monitor, contamination levels of the first effluent from the first set of reservoirs and contamination levels of the second effluent from the second set of reservoirs.

14. The method of claim 13, further comprising using a control system for:
    controlling the conditioning of the first brush by comparing the contamination levels of the first effluent in the first set of reservoirs to a first contamination threshold; and
    controlling the conditioning of the second brush by comparing the contamination levels of the second effluent in the second set of reservoirs to a second contamination threshold.

15. The method of claim 13, wherein each of the first and second brush stations comprises a corresponding brush support.

16. The method of claim 15, wherein at least one brush support is at a fixed angle in the respective brush station.

17. The method of claim 15, further comprising performing by at least one brush support one or both of: receiving a brush for conditioning in one of a plurality of different angles; and adjusting an angle of a brush received for conditioning.

18. The method of claim 13, wherein the contamination levels comprises at least one of: a liquid particle count, a pH level, or a resistivity.

19. The method of claim 13, further comprising recording to memory at least a portion of the contamination levels of the first effluent and the second effluent in real-time.

20. The method of claim 13, further comprising a pump system downstream of the first and second sets of reservoirs configured to pump the first and second effluents.

\* \* \* \* \*